United States Patent
Morimoto

(10) Patent No.: US 7,760,931 B2
(45) Date of Patent: Jul. 20, 2010

(54) APPARATUS AND METHOD FOR MEASURING AT LEAST ONE OF ARRANGEMENT AND SHAPE OF SHOTS ON SUBSTRATE, EXPOSURE APPARATUS, AND DEVICE MANUFACTURING METHOD

(75) Inventor: Osamu Morimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 894 days.

(21) Appl. No.: 11/567,896

(22) Filed: Dec. 7, 2006

(65) Prior Publication Data

US 2007/0133864 A1 Jun. 14, 2007

(30) Foreign Application Priority Data

Dec. 8, 2005 (JP) ............................. 2005-355304

(51) Int. Cl.
*G06K 9/00* (2006.01)
(52) U.S. Cl. ...................................................... 382/151
(58) Field of Classification Search ........................ None
See application file for complete search history.

(56) References Cited

U.S. PATENT DOCUMENTS 5,805,866 A * 9/1998 Magome et al. ............... 716/19

FOREIGN PATENT DOCUMENTS

JP 2003-086483 3/2003

* cited by examiner

*Primary Examiner*—Brian P Werner
(74) *Attorney, Agent, or Firm*—Cowan, Liebowitz & Latman, P.C.

(57) ABSTRACT

An apparatus for measuring at least one of an arrangement and shape of shots formed on a substrate, comprises a scope configured to obtain an image of an alignment mark corresponding to a shot; and a calculating device configured to calculate a difference between a position of the alignment mark in the image obtained by the scope and a designed position of the alignment mark, obtain a non-linear component of the calculated difference with respect to each of a plurality of conditions, calculate an index indicating a stability of the non-linear component of each shot with respect to each of the plurality of conditions, and select, from the plurality of conditions, a condition for obtaining the non-linear component based on the calculated indices.

8 Claims, 15 Drawing Sheets

FIG. 6

| WAFER NUMBER | SHOT NUMBER | SHOT DESIGN COORDINATE X[mm] | SHOT DESIGN COORDINATE Y[mm] | DISPLACEMENT AMOUNT X[nm] | DISPLACEMENT AMOUNT Y[nm] |
|---|---|---|---|---|---|
| 1 | 1 | 60.0 | 150.0 | 12.5 | -32.5 |
| 1 | 2 | 80.0 | 150.0 | -8.0 | -31.4 |
| : | : | : | : | : | : |
| 1 | n | -80 | -150.0 | 32.0 | -44.2 |
| 2 | 1 | 60.0 | 150.0 | 8.0 | -25 |
| 2 | 2 | 80.0 | 150.0 | -6.5 | -24.2 |
| : | : | : | : | : | : |
| m | n | -80 | -150.0 | 24.2 | -34.5 | r = 1/2 · x r = x r = √2 · x r = 2 · x

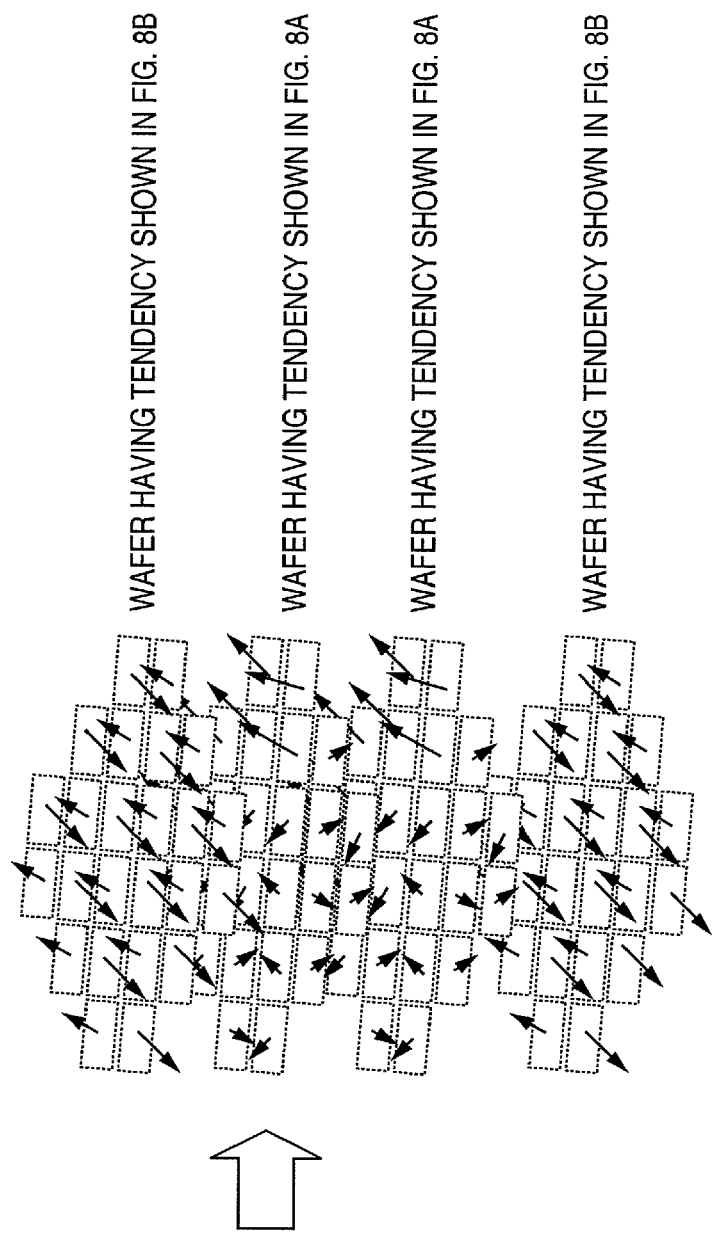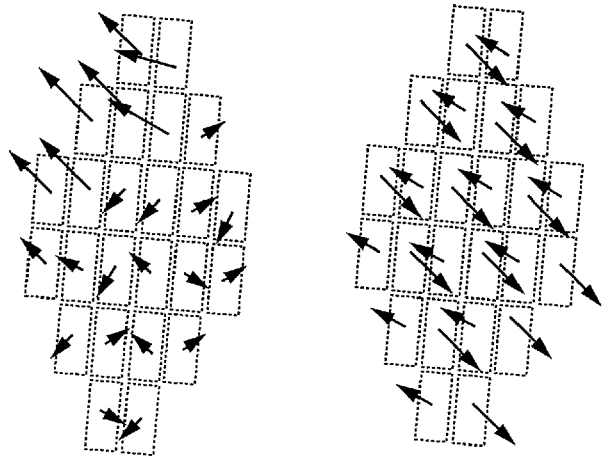

FIG. 11A

TABLE N

| WAFER NUMBER | SHOT NUMBER | DISPLACEMENT AMOUNT X[nm] | DISPLACEMENT AMOUNT Y[nm] |
|---|---|---|---|
| 1 | 1 | $N_1X_1$ | $N_1Y_1$ |
| 1 | 2 | $N_1X_2$ | $N_1Y_2$ |
| ... | ... | ... | ... |
| 1 | n | $N_1X_n$ | $N_1Y_n$ |
| 2 | 1 | $N_2X_1$ | $N_2Y_1$ |
| ... | ... | ... | ... |
| 2 | n | $N_2X_n$ | $N_2Y_n$ |
| ... | ... | ... | ... |
| m | 1 | $N_mX_1$ | $N_mY_1$ |
| ... | ... | ... | ... |
| m | n | $N_mX_n$ | $N_mY_n$ |

FIG. 11B

TABLE P

| WAFER NUMBER | SHOT NUMBER | DISPLACEMENT AMOUNT X[nm] | DISPLACEMENT AMOUNT Y[nm] |
|---|---|---|---|
| 1 | 1 | $P_1X_1$ | $P_1Y_1$ |
| 1 | 2 | $P_1X_2$ | $P_1Y_2$ |
| ... | ... | ... | ... |
| 1 | n | $P_1X_n$ | $P_1Y_n$ |

FIG. 11C

TABLE C

| WAFER NUMBER | SHOT NUMBER | DISPLACEMENT AMOUNT X[nm] | DISPLACEMENT AMOUNT Y[nm] |
|---|---|---|---|
| 1 | 1 | $C_1X_1$ | $C_1Y_1$ |
| 1 | 2 | $C_1X_2$ | $C_1Y_2$ |
| ... | ... | ... | ... |
| 1 | n | $C_1X_n$ | $C_1Y_n$ |
| 2 | 1 | $C_2X_1$ | $C_2Y_1$ |
| ... | ... | ... | ... |
| 2 | n | $C_2X_n$ | $C_2Y_n$ |
| ... | ... | ... | ... |
| m | 1 | $C_mX_1$ | $C_mY_1$ |
| ... | ... | ... | ... |
| m | n | $C_mX_n$ | $C_mY_n$ |

$\sigma_{total}$ : VARIATION (STANDARD DEVIATION) IN RESIDUALS OF ALL SHOTS AMONG ALL WAFERS $$NLS = \frac{\sigma_{total}}{\sigma_{nmean}}$$

$\sigma_i$ : VARIATION (STANDARD DEVIATION) IN RESIDUAL OF i-TH SHOT OF EACH WAFER $$\sigma_{nmean} = \frac{1}{n}\sum_{i=1}^{n}\sigma_i$$

APPARATUS AND METHOD FOR MEASURING AT LEAST ONE OF ARRANGEMENT AND SHAPE OF SHOTS ON SUBSTRATE, EXPOSURE APPARATUS, AND DEVICE MANUFACTURING METHOD

BACKGROUND OF THE INVENTION

1. Field of the Invention

The present invention relates to a technique for measuring at least one of arrangement and shape of shots on a substrate.

2. Description of the Related Art

A reduction projection exposure apparatus manufactures a semiconductor element by projecting and forming a circuit pattern on a substrate by exposure. Along with the advance in circuit micropatterning, the reduction projection exposure apparatus is demanded to highly accurately align a circuit pattern formed on a reticle and an existing pattern formed on a wafer.

A widely used wafer alignment method is global alignment for detecting the displacement amounts of alignment marks, which are formed on some exposure shot regions on a wafer, from their design values and calculating the regularity of a shot array, thereby aligning the shot regions. This method has a merit of performing alignment using limited sample shots without alignment error measurement of all exposure shots to increase the apparatus throughput.

In general, an increase in the number of sample shots in global alignment enhances an averaging effect, resulting in higher measurement accuracy. Note, however, that no linear correction by global alignment allows correction of a non-linear error due to non-linear distortion in an exposure shot array. It is therefore impossible to attain a sufficient accuracy.

Even when a method of increasing the correction accuracy, such as alignment for each exposure shot or so-called zone alignment, i.e., linear correction limited to some regions is used, it is still difficult to increase both the throughput and accuracy.

A stage driving mechanism or the like of an exposure apparatus having exposed an alignment target layer may cause a step-direction difference offset or scan-direction difference offset. This makes it difficult to increase the alignment accuracy using a partial linear zone alignment or an alignment method which considers the weight of the measurement value of the neighborhood of an exposure shot in a correction equation.

Japanese Patent Laid-Open No. 2003-086483 proposes a method of generating a correction table which describes offsets for respective shots. First, a correction table is generated in advance by defining, as an offset per exposure shot, a non-linear error component remaining after linear correction. This correction table is based on alignment measurement results of a plurality of shots (normally, all exposure shots or exposure shots in a number larger than that required in global alignment) in a wafer. A large number of exposure shots necessary for correction table generation may be measured on a plurality of wafers in a lot. The measurement results of a large number of exposure shots obtained by an alignment measurement apparatus separate from an exposure apparatus may be used. After the measurement, the exposure apparatus shifts and exposes each exposure shot in accordance with the correction table. When a non-linear error component is stable in a lot, the same correction table can be referred to and requires no update in this lot. This method makes it possible to prevent deterioration in correction accuracy due to a non-linear error without decreasing the throughput.

Japanese Patent Laid-Open No. 2003-086483 also discloses a method which attains higher accuracy by statistically processing alignment measurement results of one exposure shot and exposure shots arrayed near the exposure shot when calculating a shot-specific correction table. For example, as shown in FIG. 1A, hatched exposure shots each having a center included in a circle Ca, which has an arbitrary radius r and a center that coincides with the center of a given exposure shot Sa, are defined as "neighboring shots" with respect to the center shot Sa. The average of alignment measurement results (the displacement amounts of exposure shots indicated by arrows in FIG. 1A) of the center shot Sa and neighboring shots is defined as the displacement correction amount of the center shot Sa. This makes it possible to correct local non-linear distortion and reduce error components of an alignment measurement system by an averaging effect (this process will be called a "neighborhood averaging process" hereinafter).

As illustrated in FIG. 1B, the neighborhood of the wafer edge often suffers alignment measurement errors. This generates discrete values as indicated by shots Sb. Simply averaging neighboring shots may make measurement errors of the shots Sb adversely affect the correction amount of the center shot Sa. To prevent this, the use of the median of neighboring shots is better than the use of their simple average (this process will be called a neighborhood median process" hereinafter). The use of the median of neighboring shots makes it possible to correct local non-linear distortion and produce an abnormal value elimination effect.

Depending on the characteristic of a stage of an exposure apparatus having exposed a target layer, different displacement amount measurement results may alternate among adjacent shots as shown in FIG. 1C.

These phenomena result from errors unique to a stage of an exposure apparatus, such as a step-direction difference offset caused depending on the step direction of a stage or a scan-direction difference offset caused depending on the scan direction of a scanner. When the correction value of the center shot Sa is calculated by a neighborhood averaging process while displacement measurement results polarize, as shown in FIG. 1C, the correction amount becomes nearly zero. This sometimes leads to unsatisfactory correction. The same applies to the neighborhood median process.

Japanese Patent Laid-Open No. 2003-086483 also discloses a method effective in aligning a wafer having systematic non-linear errors multipolarized by exposure shots. This method is to cluster the displacement amount measurement results of exposure shots arrayed around a given shot by discriminant analysis and calculate the average and median of the displacement amounts of a cluster to which the exposure shot belongs (this process will be called a "neighborhood clustering process" hereinafter).

According to Japanese Patent Laid-Open No. 2003-086483, the displacement amounts of exposure shots are held as a correction table in advance using a predetermined transformation to calculate the total misalignment of a substrate to be aligned from a plurality of sample shot positions and to sequentially reflect the displacement amounts of the correction table in exposure positions during exposure. This makes it possible to prevent a decrease in accuracy due to non-linear distortion, thus attaining highly accurate alignment. This patent reference also describes a plurality of algorisms suitable to correct non-linear errors due to various factors.

The methods disclosed in Japanese Patent Laid-Open No. 2003-086483 can highly accurately correct a non-linear error in a wafer to be aligned. However, these methods pose the following two problems (i) and (ii).

(i) Of the plurality of methods (the neighboring average process, neighborhood median process, and neighborhood clustering process) disclosed in Japanese Patent Laid-Open No. 2003-086483, a method to be applied is empirically determined. That is, an operator has no choice but to empirically create a shot-specific correction table by using these methods in practice and performing exposure based on the table, thereby selecting the most satisfactory correction result. Several definitions of neighboring shots are also present upon a change in the radius r shown in FIG. 1A (FIGS. 7A to 7D). To select optimal neighboring shots, an operator has no choice but to confirm exposure results, resulting in very poor efficiency. A variety of definitions of neighboring shots and a variety of conditions for a combination of a plurality of methods are available. It is therefore almost impossible for an operator to confirm exposure results of all the above definitions and conditions.

(ii) The methods disclosed in Japanese Patent Laid-Open No. 2003-086483 refer to the same non-linear correction table in a lot. When the non-linear tendency changes for each wafer in the lot, an operator has no choice but to average the changes in tendency. This sometimes prevents optimal correction for each wafer.

Since shift and rotation errors of alignment errors are unique to an exposure apparatus, e.g., error components of a wafer transfer system, their stabilities in a lot are supposed to be high. A magnification error and non-linear error presumably occur due to thermal deformation of a wafer and resist film irregularity caused by processes in devices other than an exposure apparatus.

When a device other than an exposure apparatus applies a batch process of a plurality of wafers to polishing by CMP, resist coating which causes nonuniformity, or film formation which accompanies annealing, the tendency of heat or coating nonuniformity may change for each of the wafers having undergone the batch process. For example, when a lot processed by an annealing device which executes a batch process of five wafers is measured, the alignment measurement result changes for each wafer. This causes non-linear errors at intervals of five wafers. When batch processes of different number of wafers are applied to a plurality of steps, e.g., when batch processes of five wafers and two wafers are applied to film formation and polishing, and non-linear errors due to the respective steps are superposed, the occurrence tendency of wafers having the same non-linear errors is unpredictable.

SUMMARY OF THE INVENTION

The present invention has been made in consideration of the above background, and has as its exemplary object to provide a novel technique for measuring at least one of the arrangement and shape of shots on a substrate.

In order to achieve the above object, according to the present invention, there is provided an apparatus for measuring at least one of arrangement and shape of shots formed on a substrate, the apparatus comprising: a scope configured to obtain an image of an alignment mark corresponding to a shot; and a calculating device configured to calculate a difference between a position of the alignment mark in the image obtained by the scope and a designed position of the alignment mark, obtain a non-linear component of the calculated difference with respect to each of a plurality of conditions, calculate an index indicating a stability of the non-linear component of each shot with respect to each of the plurality of conditions, and select, from the plurality of conditions, a condition for obtaining the non-linear component based on the calculated indices.

There is also provided an exposure apparatus for exposing a substrate to a pattern, the apparatus comprising: a stage configured to hold the substrate and to move; an apparatus as defined above; and a controller configured to control movement of the stage based on at least one of arrangement and shape of shots on the substrate measured by the apparatus as defined above.

There is also provided a method of manufacturing a device, the method comprising steps of: exposing a substrate to a pattern using an exposure apparatus as defined above; developing the exposed substrate; and processing the developed substrate to manufacture the device.

There is also provided a method of measuring at least one of arrangement and shape of shots formed on a substrate, the method comprising step of: obtaining an image of an alignment mark corresponding to a shot; calculating a difference between a position of the alignment mark in the image and a designed position of the recorded alignment mark; obtaining a non-linear component of the calculated difference with respect to each of a plurality of conditions; calculating an index indicating a stability of the non-linear component of each shot with respect to each of the plurality of conditions; and selecting, from the plurality of conditions, a condition for obtaining the non-linear component based on the calculated indices.

There is also provided an apparatus for measuring at least one of arrangement and shape of shots formed on a substrate, the apparatus comprising: detecting means for detecting a position of an alignment mark corresponding to a shot; and first calculating means for calculating a difference between the detected position of the alignment mark and a designed position of the alignment mark; second calculating means for calculating a non-linear component of the calculated difference with respect to each of a plurality of conditions; third calculating means for calculating an index indicating a stability of the non-linear component of each shot with respect to each of the plurality of conditions; and selecting means for selecting, from the plurality of conditions, a condition for obtaining the non-linear component based on the calculated indices.

There is also provided an exposure apparatus for exposing a substrate to a pattern, the apparatus comprising: positioning means for positioning the substrate; an apparatus as defined above; and controlling means for controlling a position of the positioning means based on at least one of arrangement and shape of shots on the substrate measured by the apparatus as defined above.

There is also provided a method of manufacturing a device, the method comprising steps of: exposing a substrate to a pattern using an exposure apparatus as defined above; developing the exposed substrate; and processing the developed substrate to manufacture the device.

There is also provided a method of measuring at least one of arrangement and shape of shots formed on a substrate, the method comprising steps of: detecting a position of an alignment mark corresponding to a shot; and calculating a difference between the detected position of the alignment mark and a designed position of the alignment mark; calculating a non-linear component of the calculated difference with respect to each of a plurality of conditions; calculating an index indicating a stability of the non-linear component of each shot with respect to each of the plurality of conditions; and selecting, from the plurality of conditions, a condition for obtaining the non-linear component based on the calculated indices.

According to the present invention, it is possible to provide, e.g., a novel technique for measuring at least one of the arrangement and shape of shots on a substrate with high accuracy and high throughput.

Further features of the present invention will become apparent from the following description of exemplary embodiments (with reference to the attached drawings).

BRIEF DESCRIPTION OF THE DRAWINGS

FIG. 6 is a view illustrating a data table of alignment measurement results of all shots of all wafers according to the first embodiment;

FIGS. 8A to 8C are views showing a difference in non-linear occurrence tendency in a lot;

FIGS. 11A to 11C are views illustrating a linear correction residual table N, shot-specific correction table P, and prospective correction result table C used in calculating a stability index (NLS) under each non-linear correction condition shown in FIG. 5;

DESCRIPTION OF THE EMBODIMENTS

Embodiments according to the present invention will be described in detail below with reference to the accompanying drawings.

Note that the embodiments to be described hereinafter are merely practical examples of the present invention and can be appropriately modified or changed in accordance with various conditions and the arrangement of an apparatus to which the present invention is applied.

The present invention is applicable to various precision processing apparatuses, various precision measurement apparatuses, and a method of manufacturing a semiconductor device or the like using these device manufacturing apparatuses, in addition to the device manufacture to be described below.

The present invention is achieved even by supplying a storage medium which stores software program codes for implementing the functions of the embodiments to be described later to an exposure apparatus and causing the computer (or CPU or MPU) to read out and execute the program codes stored in the storage medium.

First Embodiment

A technique which is cited in problem (i) and causes an apparatus to automatically select an optimal algorism without exposing the lot will be explained below as the first embodiment.

Figure 3:
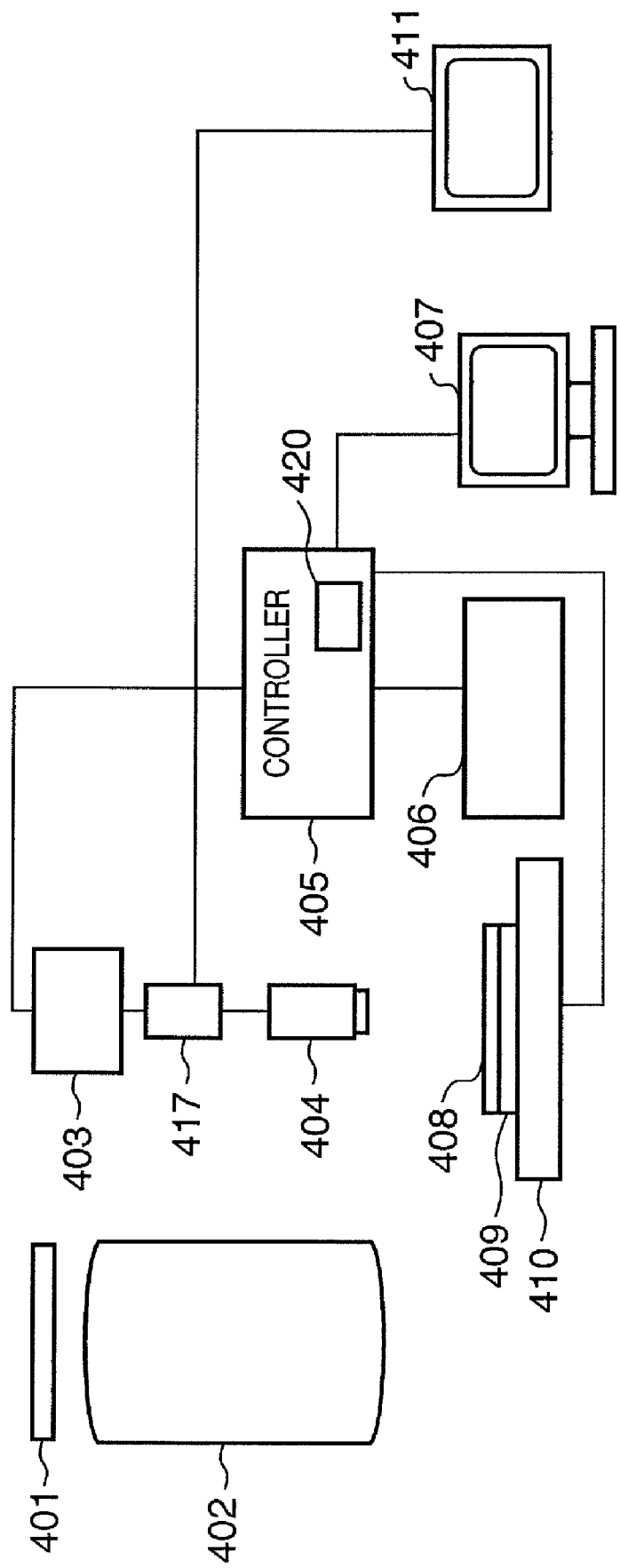
FIG. 3 is a schematic view showing an off-axis wafer alignment system in a reduction projection exposure apparatus according to the first embodiment of the present invention.

FIG. 3 is a schematic view showing an off-axis wafer alignment system in a reduction projection exposure apparatus according to this embodiment.

Referring to FIG. 3, reference numeral 401 denotes a reticle; 402, a projection optical system; and 403, an image storing and calculating device which executes various image calculation processes for an input image signal, and stores the image signal and processing result. A pre-alignment device 406 coarsely adjusts the orientation of a wafer from its contour criterion when a wafer loading device (not shown) feeds the wafer to an alignment system. A computer terminal 407 accepts a command input by a user. A wafer 408 serves as an alignment target. A microscope 404 allows an operator to observe a pattern image formed on the wafer 408 while enlarging it. A CCD camera 417 converts the pattern image on the wafer 408 obtained via the microscope 404 into an electrical signal, and sends it to the image storing and calculating device 403. An X-Y stage 410 horizontally or vertically moves the wafer 408. A wafer chuck 409 holds the wafer 408 on the X-Y stage 410. A monitor 411 serves as a display unit which allows an operator to directly confirm an image in the microscope 404. A controller 405 controls the above-described devices. The controller 405 comprises a memory 420 and CPU. The microscope 404 and CCD camera 417 will be called an off-axis observation optical system or alignment scope hereinafter.

Referring to FIG. 3, FRA (Fine Reticle Alignment) or the other method accurately determines the positions of the reticle 401 and projection optical system 402. The relative positional relationships (baselines) between the projection optical system 402 and the off-axis observation optical systems 404 and 417 have already been measured.

Figure 1A:
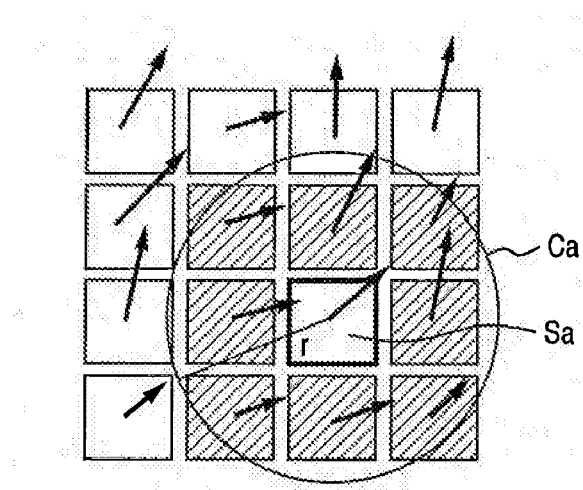
FIGS. 1A to 1C are views for explaining a non-linear error component correction process serving as the premise of the present invention.
Figure 1B:
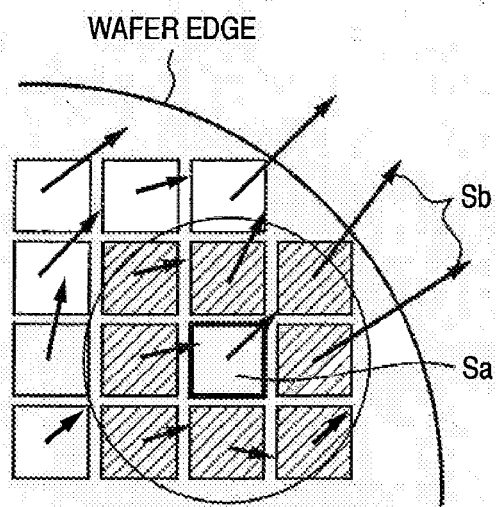
Figure 1C:
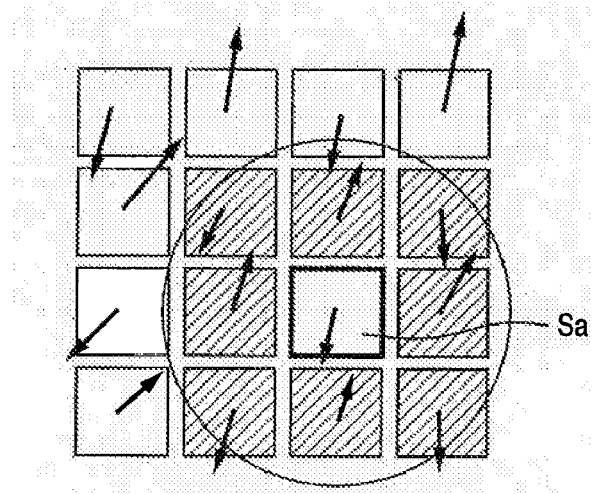
Figure 2A:
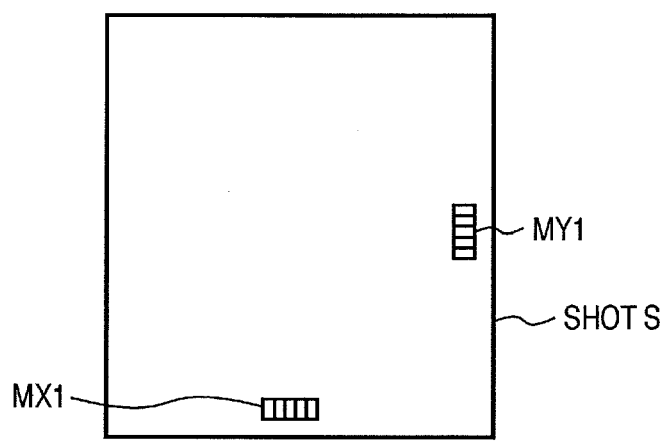
FIGS. 2A to 2C are views illustrating shots and alignment marks on a wafer.
Figure 2B:
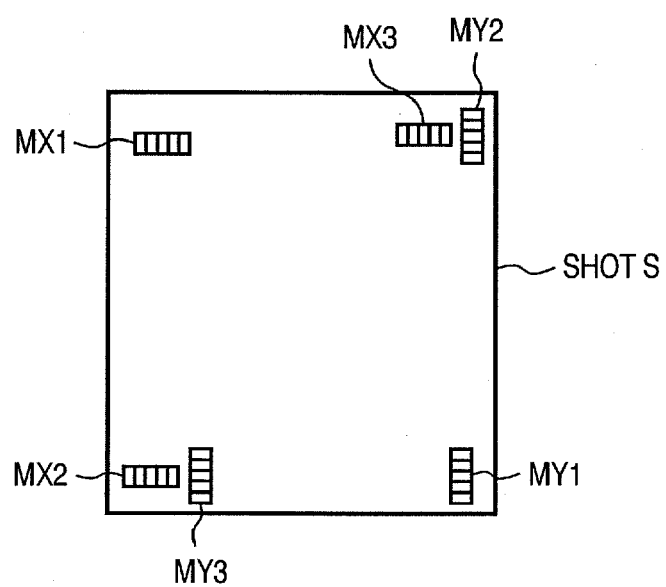
Figure 2C:
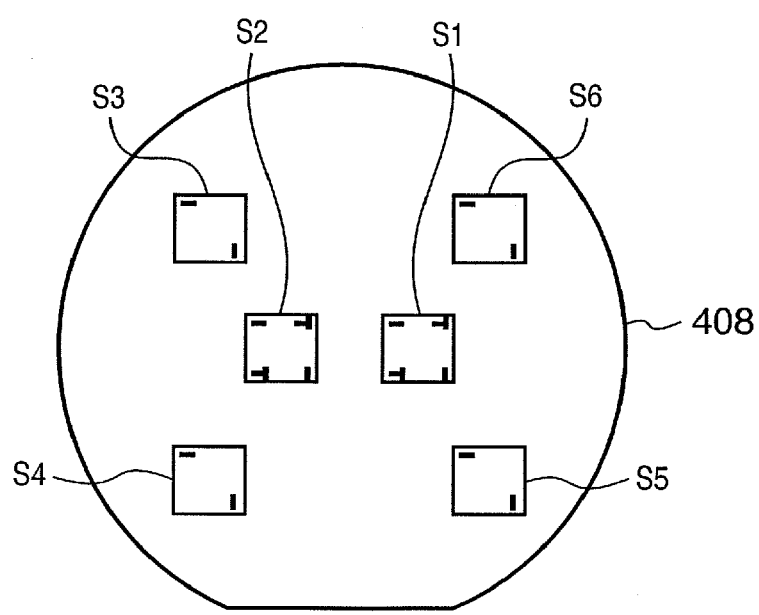

Shot regions Si (i=1 to n) serving as the overlay exposure targets are formed on the wafer 408, as shown in FIG. 2C. Alignment marks MX1 and MY1 shown in FIG. 2A are formed on each exposure shot Si. Detecting the positions of these marks makes it possible to calculate the displacement amounts or differences of shot positions.

A large number of marks MXi and MYi are sometimes formed as shown in FIG. 2B. Detecting the positions of one or more pairs of X and Y marks makes it possible to calculate the shot shape (shot magnification and shot rotation). In normal exposure, a plurality of wafers 408 are continuously processed.

Figure 4:
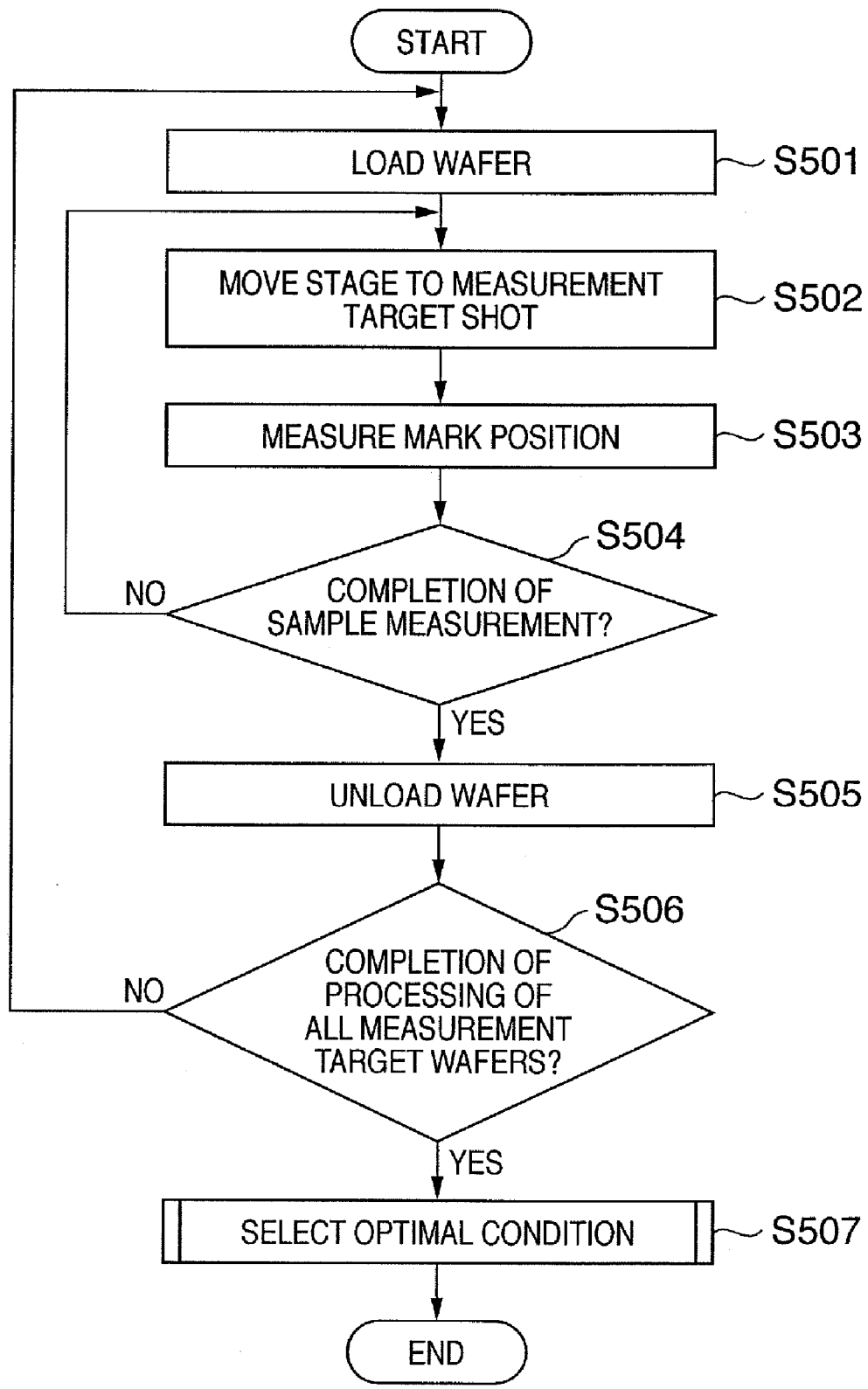
FIG. 4 is a flowchart showing an alignment measurement process according to the first embodiment of the present invention.

FIG. 4 is a flowchart showing an alignment measurement process according to this embodiment.

The image storing and calculating device 403 shown in FIG. 3 can automatically execute (without any intervention of an operator), e.g., a calculation processing procedure and a procedure for saving data obtained by the calculation process in this embodiment.

Referring to FIG. 4, a wafer transport device (not shown) supplies the wafer 408 to the exposure apparatus in step S501. The pre-alignment device 406 coarsely aligns the wafer 408 to transport it onto the X-Y stage 410. The wafer chuck 409 on the X-Y stage 410 holds the wafer 408 by vacuum suction.

In steps S502 to S505, the displacement amount of each exposure shot is automatically measured.

In step S502, the controller 405 drives the X-Y stage 410 so that the alignment mark MX1 formed on the first measurement shot S1 falls within the field of the microscope 404.

In step S503, a mark displacement is detected. A mark displacement is detected in the following way.

The microscope 404 and CCD camera 417 record, as an image signal, the pattern of the alignment mark MX1 illuminated with an alignment illumination device (not shown). The controller 405 collates by pattern matching the pattern of the alignment mark stored in the image storing and calculating device 403 with the image recorded by the CCD camera 417 to calculate the displacement amount of the alignment mark MX1 from its design position. The image storing and calculating device 403 stores the calculated displacement amount as the displacement amount of each shot of the processed wafer. As shown in FIG. 6, the image storing and calculating device 403 stores a table which contains a wafer number for specifying a measured wafer, a shot number for specifying a shot on a wafer, shot design coordinates X and Y, and information about the displacement amounts X and Y of the shot.

It is determined in step S504 whether all (n) measurement target shots (S1 to Sn) have undergone the processes in steps S502 and S503. If an unprocessed shot remains, the process returns to step S502; otherwise, the process advances to step S505.

After measuring the displacement amounts of marks of all sample shots, the wafer is unloaded outside the apparatus in step S505. It is determined in step S506 whether all wafers (in this example, the wafer count is m) as the measurement processing targets have already undergone the processes from step S502 to step S505. If the processes for all wafers are complete, the process advances to step S507; otherwise, the process returns to step S501 to continue the processes for the next target wafer.

In step S507, by using the measurement results of all shots (FIG. 6) of all the wafers stored in the image storing and calculating device 403, an optimal non-linear correction condition is determined for the lot currently being processed.

Figure 5:
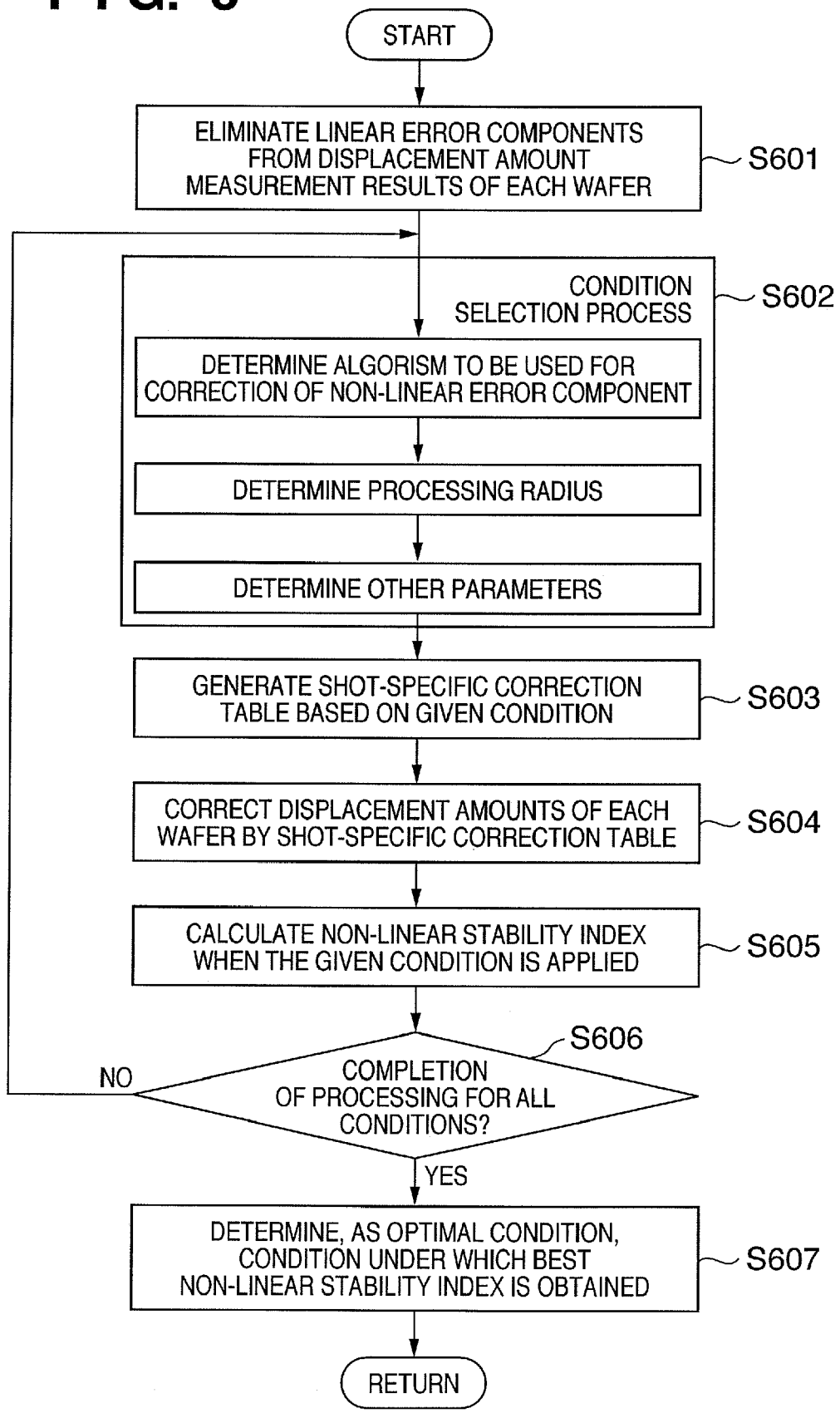
FIG. 5 is a flowchart showing an optimal non-linear correction condition determination process in step S507 of FIG. 4.
Figure 7A:
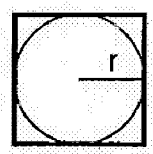
FIGS. 7A to 7D are views for explaining the definition of neighboring shots, which is used in a non-linear correction process according to the first embodiment.
Figure 7B:
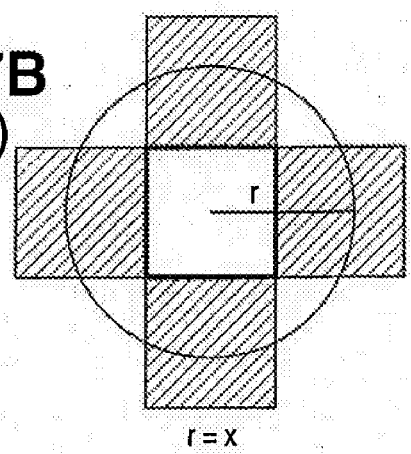
Figure 7C:
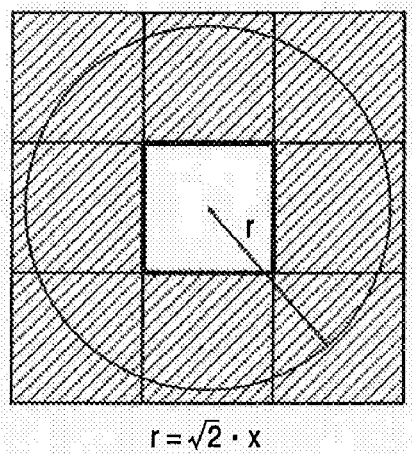
Figure 7D:
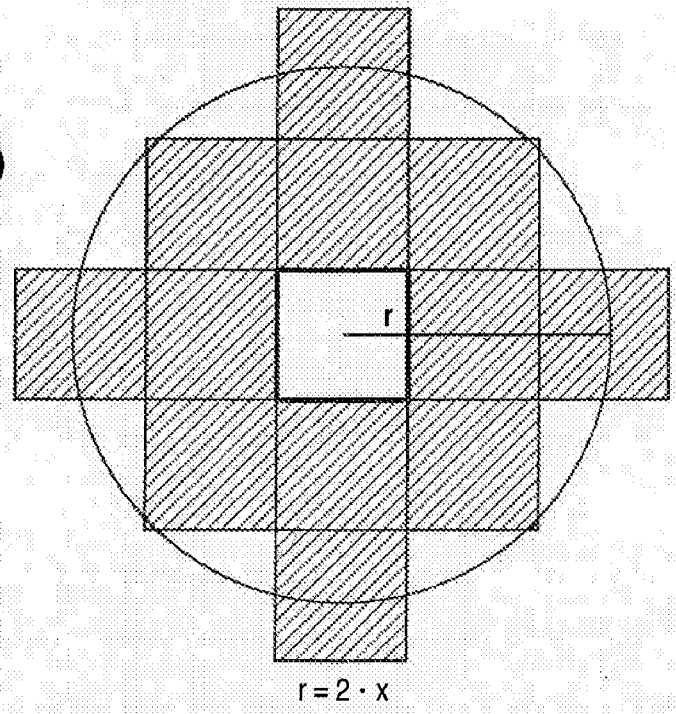

FIG. 5 is a flowchart showing an optimal non-linear correction condition determination process in step S507 of FIG. 4.

Referring to FIG. 5, an arithmetic process for eliminating linear error components from the displacement amount measurement results of all shots of each wafer is performed in step S601. The elimination of linear error components is to eliminate, from displacement measurement results of all shots, shift, magnification, and rotation errors calculated by a general global alignment arithmetic method. The image storing and calculating device 403 stores a table N (which takes the same format as that shown in FIG. 6 even though linear correction residuals replace data of displacement amounts X and Y) of linear correction residual errors (also called non-linear errors or non-linear components) thus obtained.

In step S602, one non-linear correction condition is selected from a plurality of different non-linear correction conditions for correcting non-linear errors. In this case, the "non-linear correction condition" indicates a condition to be defined in the conduct of non-linear correction, such as the selection of one of the algorism methods (neighborhood averaging process, neighborhood median process, and neighborhood clustering process) described in "background of the invention", or the definition of processing shots in the conduct of these processes. For example, neighboring processing shots may be defined as "shots each having a center that falls within a circle with a radius r from the center of a target shot" where r is a non-linear correction condition.

In this embodiment, as shown in FIGS. 7A to 7D, r can take a value of X/2, X, √2X, or 2X where X is the shot size (a shot is assumed to plot a square). Other conditions such as the threshold value of abnormal value elimination are conceivable. In this embodiment, non-linear correction conditions in a number calculated by "the number of combinations of possible values r"×"the number of types of algorism" exist. In step S602, all conditions are numbered to select one non-linear correction condition from them in numerical order.

In step S603, by using the method described in "background of the invention", a shot-specific correction table is generated based on a given non-linear correction condition. In an actual exposure process, it is difficult to measure all shots of all wafers. A shot-specific correction table P is also generated by using only the measurement result of the first wafer from the table N obtained in step S601. If, for example, the non-linear correction condition is the neighborhood averaging process and the radius r is X, data of each shot of the first wafer of the table N is used to calculate and register, as the displacement correction amount of the shot in the table P, the average of five shots including neighboring four shots of each row of the table N.

In step S604, the shot-specific correction table P is subtracted for each shot from the linear correction residual table N obtained in step S601 to calculate a simulated correction amount by the shot-specific correction table P. More specifically, a value obtained by subtracting offset amounts $P_1X_1$ and $P_1Y_1$ of shot number 1 of the table P from displacement amounts $N_1X_1$ and $N_1Y_1$ of shot number 1 of wafer number 1 of the table N is defined as correction results $C_1X_1$ and $C_1Y_1$. A value obtained by subtracting offset amounts $P_1X_2$ and $P_1Y_2$ of shot number 2 of the table P from displacement amounts $N_1X_2$ and $N_1Y_2$ of shot number 2 is defined as correction results $C_1X_2$ and $C_1Y_2$. The same processes are performed for shot numbers 1 to n of wafer numbers 1 to m to obtain correction results $\{C_1X_1, C_1Y_1\}$ to $\{C_mX_n, C_mY_n\}$. These correction results constitute a prospective correction result table C. FIGS. 11A to 11C illustrate the tables N, P, and C, respectively. The format of one record of each table is the same as that shown in FIG. 6 (the design coordinates of shots are omitted in FIGS. 11A to 11C).

In step S605, a non-linear stability index indicating the stability of a non-linear error component in the lot currently being processed, to which the current non-linear correction condition is applied, is calculated from the correction result table C. A non-linear stability index will be abbreviated as an NLS hereinafter.

Figure 12B:
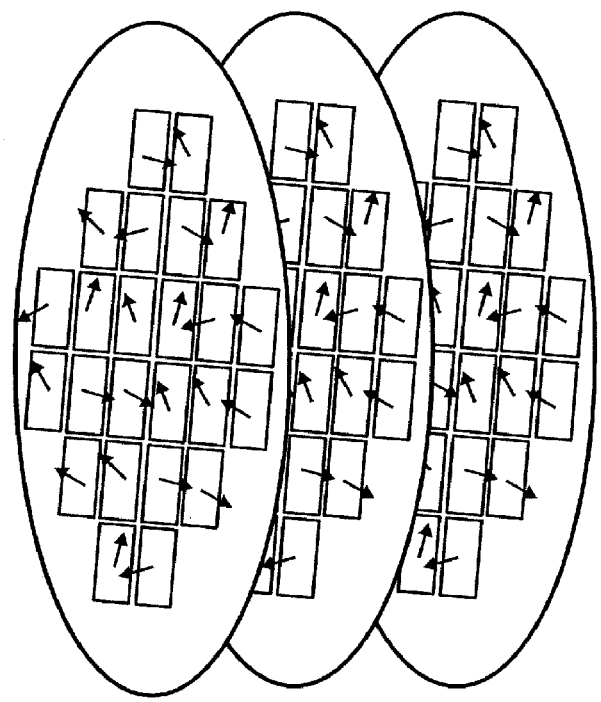
FIGS. 12A and 12B are views for explaining a stability index (NLS) under each non-linear correction condition shown in FIG. 5.
Figure 12A:
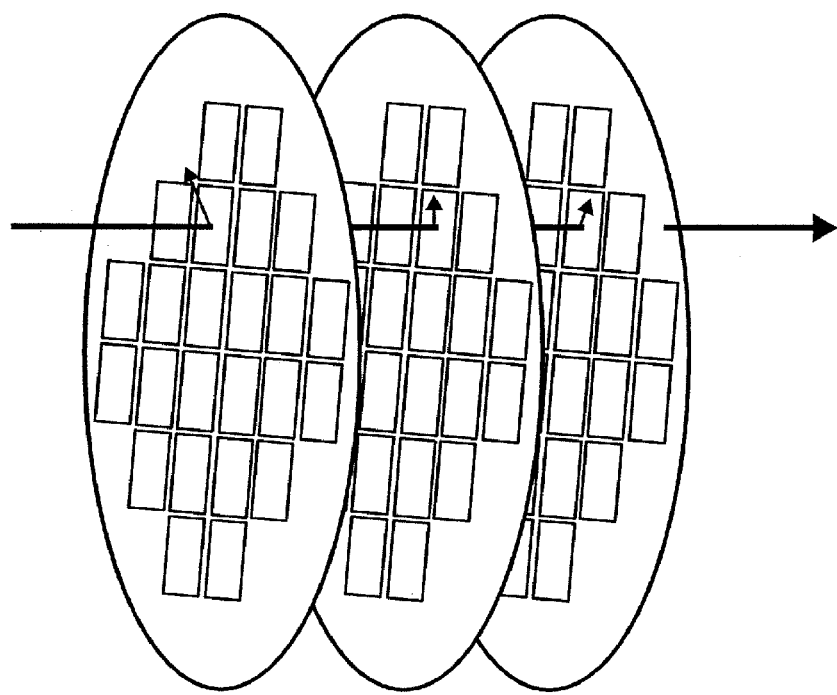

In this embodiment, a non-linear stability index NLS in a lot is defined by:

$$NLS = \sigma_{total}/\sigma_{nmean}$$

where $\sigma_{total}$ is "the total standard deviation of all wafers and all shots", and $\sigma_{nmean}$ is "the average of standard deviations of each shot (of all wafers)". FIGS. 12A and 12B show their respective meanings. That is, the NLS of a displacement amount along the X direction can be expressed by:

$$NLS = \sqrt{\frac{1}{n*m} \sum_{i=1}^{m}\sum_{j=1}^{n}(C_i X_j - [CX])^2 \Big/ \frac{1}{n}\sum_{j=1}^{n}\sqrt{\frac{1}{m}\cdot\sum_{i=1}^{m}(C_i X_j - [CX_j])^2}} \quad (1)$$

where [CX] is the average of residuals of all wafers and all shots along the X direction, and $[CX_j]$ is the average of residuals of shot number j of all wafers along the X direction.

In equation (1), the numerator represents a variation in non-linear components in the whole lot, and the denominator represents a variation in non-linear components of each shot among wafers i.e., the degree of uniformity of the displacement amounts of each shot in the lot, as shown in FIG. 12A. As the shot-specific correction table P corrects a larger number of common non-linear error components in a lot, the numerator approximates the denominator, i.e., the NLS value thus defined becomes nearly one. When a non-linear error common among wafers in a lot remains, a variation in non-linear components of each shot having an identical shot number decreases. Since the numerator in equation (1) becomes smaller, the NLS becomes larger. That is, it is possible to use an NLS as an index indicating the sufficiency of non-linear correction. The condition NLS=1 indicates a non-linear error correction limit. Calculating the NLS of the prospective correction result table C makes it possible to find the magnitude of a non-linear error which still remains in the table C (and can be corrected by the shot-specific correction table P).

It is determined in step S606 whether the processes from step S602 to S605 are performed for all non-linear correction conditions. If a non-linear correction condition to calculate the NLS remains, the process advances to step S602 to select the condition and repeatedly continue the processes in steps S603 to S605. If calculation of the NLSs under all conditions is complete, the process advances to step S607.

In step S607, a non-linear correction condition under which the non-linear stability index is closest to one is selected and determined as an optimal condition.

As described above, the use of a non-linear stability index in a lot makes it possible to determine an optimal non-linear error correction method and neighboring radius. In this embodiment, an exposure apparatus need only do measurement to obtain an optimal condition without any exposure for condition determination. This obviates the need for any complicate procedures of condition determination.

By applying a non-linear correction condition thus obtained, a shot-specific correction table is generated based on alignment measurement results at the top of a lot as disclosed in Japanese Patent Laid-Open No. 2003-086483. Exposing a wafer based on this result makes it possible to greatly reduce non-linear error components. It is therefore possible to obtain an exposure result with good overlay accuracy.

Unlike the above description, not all wafers in a lot to be processed need be measured in this embodiment. It suffices to compare the non-linear error stability in a lot. This embodiment is applicable as long as two or more wafers are available in principle (however, measurement of a larger number of wafers promises better results). Also unlike the above description, measurement results of all shots need not always be used to perform the same processes.

Second Embodiment

A technique which is cited in problem (ii) and satisfactorily processes a lot having changed non-linear error components will be explained below as the second embodiment.

Assume, for example, a lot as shown in FIG. 8C which includes a mixture of wafers having locally large non-linear errors as shown in FIG. 8A and wafers having errors that occur depending on the scan direction as shown in FIG. 8B. A process for determining the intervals of wafers having a tendency shown in FIG. 8A and those of wafers having a tendency shown in FIG. 8B in the lot will be explained.

Figure 9:
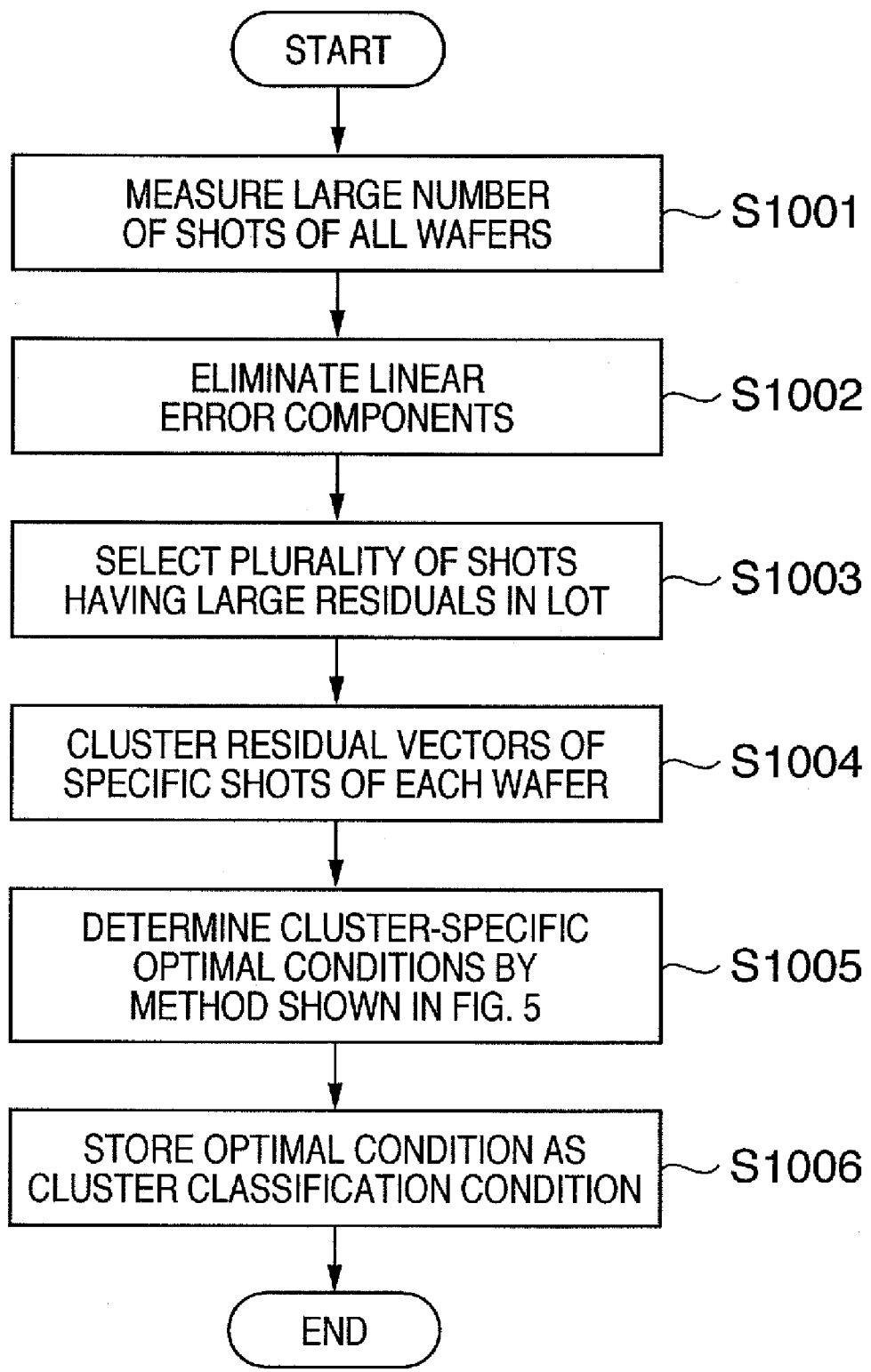
FIG. 9 is a flowchart showing a process for determining an optimal non-linear correction condition for each cluster according to the second embodiment.

FIG. 9 is a flowchart showing a process for determining an optimal non-linear correction condition for each cluster according to this embodiment.

Referring to FIG. 9, in step S1001, the displacement amounts of a large number of shots of all wafers in the target lot are measured, like the processes in steps S501 to S506 shown in FIG. 4 according to the first embodiment. A measurement result table (which takes the same format as that shown in FIG. 6) is stored.

In step S1002, like the process in step S601 of FIG. 5, an arithmetic process for eliminating linear error components from displacement amount measurement results of all shots of each wafer is performed. As in the first embodiment, the elimination of linear error components is to eliminate, from shot displacement measurement results, shift, magnification, and rotation errors calculated by a general global alignment arithmetic method. A table N (which takes the same format as that shown in FIG. 6) of linear correction residual errors thus obtained is stored.

In step S1003, one or more shots having large linear correction residuals (e.g., a shot having the largest linear correction residual (non-linear component)) in each wafer are determined from the table N as specific shots.

Figure 13:
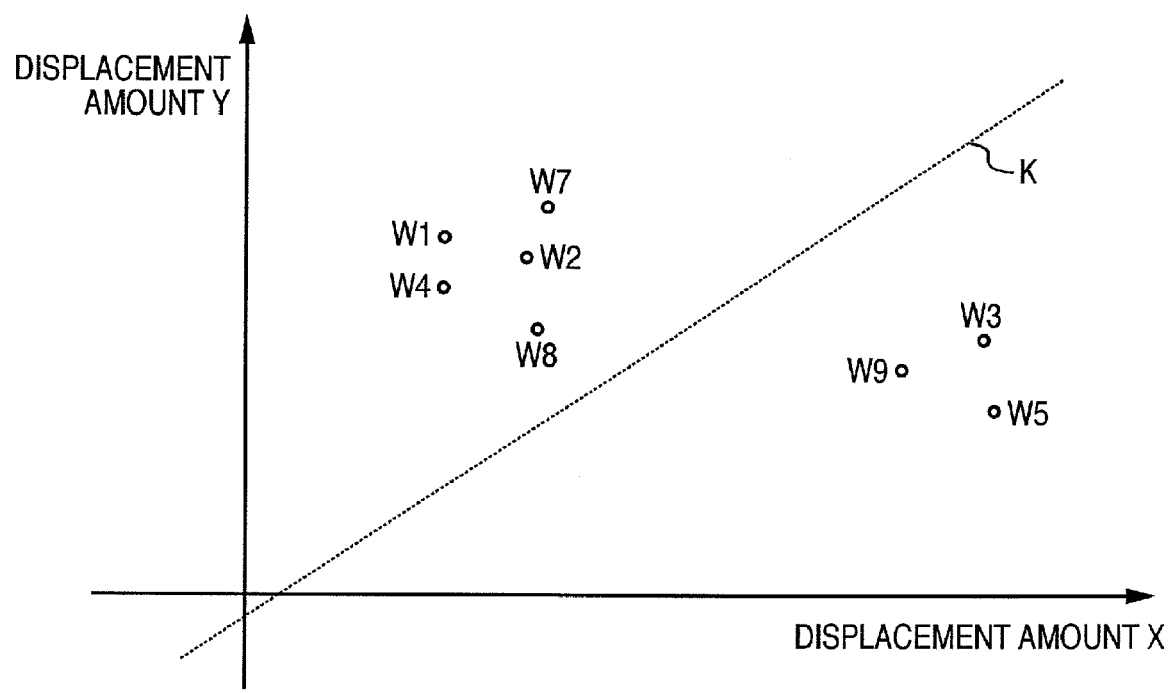
FIG. 13 is a graph showing a state in which the displacement amounts of specific shots are clustered for each wafer according to the second embodiment.

In step S1004, clustering is performed for each wafer in accordance with the displacement amounts (residual vectors) of specific shots. FIG. 13 shows a state in which displacement amounts X and Y of specific shots are clustered for each wafer. Reference symbols W1 to W9 denote displacement amounts plotted for respective wafers. A straight line K serves as a classification marginal condition. Wafers are classified into two clusters, i.e., wafers having the displacement amounts of specific shots which are distributed in the upper left region with respect to the straight line K, and wafers having the displacement amounts which are distributed in the lower right region.

In step S1005, optimal non-linear correction conditions are calculated for respective clusters classified in step S1004 by applying the method shown in FIG. 5. Apparently, when the tendencies of specific shots are clustered, it suffices to apply another algorism even when the tendency of a non-linear error component changes in a lot.

In step S1006, the shot numbers (pieces of information which specify shot positions and may be shot design coordinates) of the specific shots obtained in step S1003, the clustering marginal condition K obtained in step S1004, and the cluster-specific optimal conditions obtained in step S1005 are stored.

Figure 10:
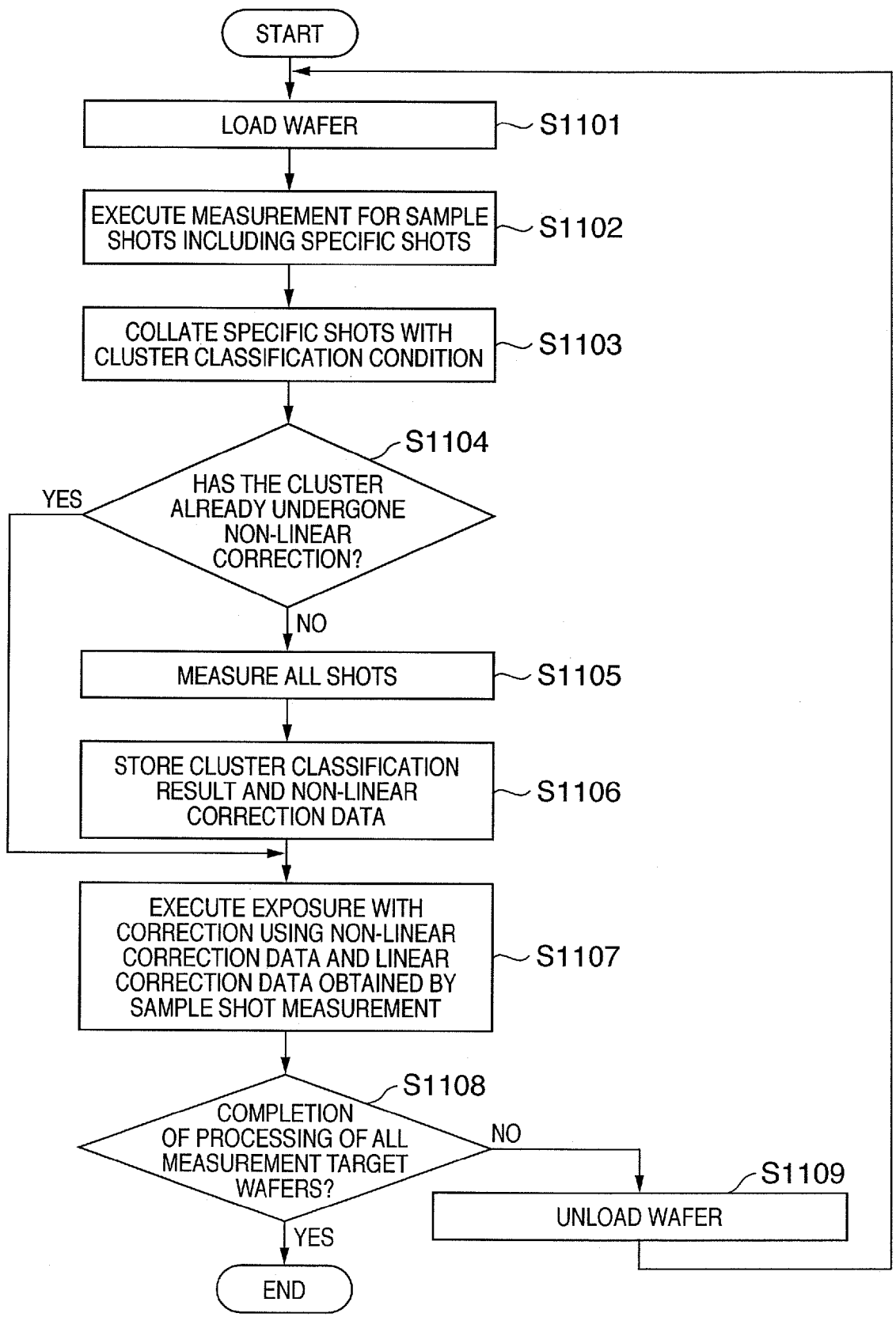
FIG. 10 is a flowchart showing an exposure process using an optimal condition determined in FIG. 9.

FIG. 10 is a flowchart showing an exposure process for obtaining, using an optimal condition determined in FIG. 9, satisfactory alignment results even when a lot includes a mixture of wafers having different non-linear error components. The exposure apparatus shown in FIG. 3 is assumed to perform this process.

In step S1101, a wafer 408 serving as an exposure target is loaded on an X-Y stage 410.

In step S1102, the displacement amounts of alignment marks are measured for a plurality of sample shots including the specific shots stored in step S1006.

In step S1103, the specific shot displacement amount measurement results obtained in step S1102 are applied to the classification marginal condition K stored in step S1006 to find a cluster which matches the wafer being processed.

It is determined in step S1104 whether the matched cluster has a shot-specific correction table (non-linear correction data). If a shot-specific correction table exists, the process advances to step S1107; otherwise, the process advances to step S1105.

In step S1105, alignment measurement of all shots (or almost all shots) is performed.

In step S1106, a shot-specific correction table is calculated and stored based on the shot measurement results obtained in step S1105 and the cluster-specific optimal non-linear correction conditions stored in step S1006.

In step S1107, exposure is performed while correcting shot positions using shot-specific non-linear correction data corresponding to a cluster to which the target wafer belongs and linear correction data obtained by shot measurement.

It is determined in step S1108 whether an unprocessed wafer remains. If an unprocessed wafer remains, the wafer is replaced to repeat the processes from step S1101; otherwise, the process ends.

As described above, the use of specific shots obviates the need for any wasteful shot measurement for each wafer. Selecting cluster-specific optimal conditions in advance makes it possible to obtain satisfactory correction results even when the tendency of a non-linear error component irregularly changes in a lot.

This embodiment has been described with reference to the case wherein the displacement amounts of specific shots are clustered as data which represents the non-linear tendency of each wafer. Another data which represents the non-linear tendency of each wafer and can be easily calculated, if any, may be clustered. For example, since a wafer magnification error occurs under the influence of thermal deformation, it sometimes has correlation with a wafer non-linear tendency. Calculation of a wafer magnification error does not require measurement for all shots. Therefore, clustering may be performed using a wafer magnification value as data which represents a wafer non-linear tendency.

Third Embodiment

The first and second embodiments have been described with reference to the case wherein an exposure apparatus executes alignment measurement using its microscope and image storing and calculating device. However, a measurement device outside the exposure apparatus may be used. An external measurement device which is called an overlay measurement device and measures an exposure result comprises a similar microscope or image storing and calculating device. Processing, using the above methods, an alignment measurement result measured by this external measurement device and feeding back the processed result as correction data during exposure makes it possible to obtain a satisfactory alignment measurement result, like the first and second embodiments.

According to the above-described embodiments, an optimal non-linear correction condition can be automatically determined based on the stability index of a non-linear error component in a lot.

Even when a non-linear error occurrence tendency changes in a lot, a satisfactory overlay exposure result can be obtained as well.

In this embodiment, non-linear error correction of the shot array or arrangement has been described. Even when a shot shape error (shot magnification error, shot rotation error, or perpendicular error) changes depending on a coordinate in a wafer, a satisfactory alignment result can be similarly obtained.

[Device Manufacturing Method]

An embodiment of a device manufacturing method using an exposure apparatus having a function of measuring at least one of the arrangement and shape of shots on a substrate as illustrated above will be described next.

Figure 14:
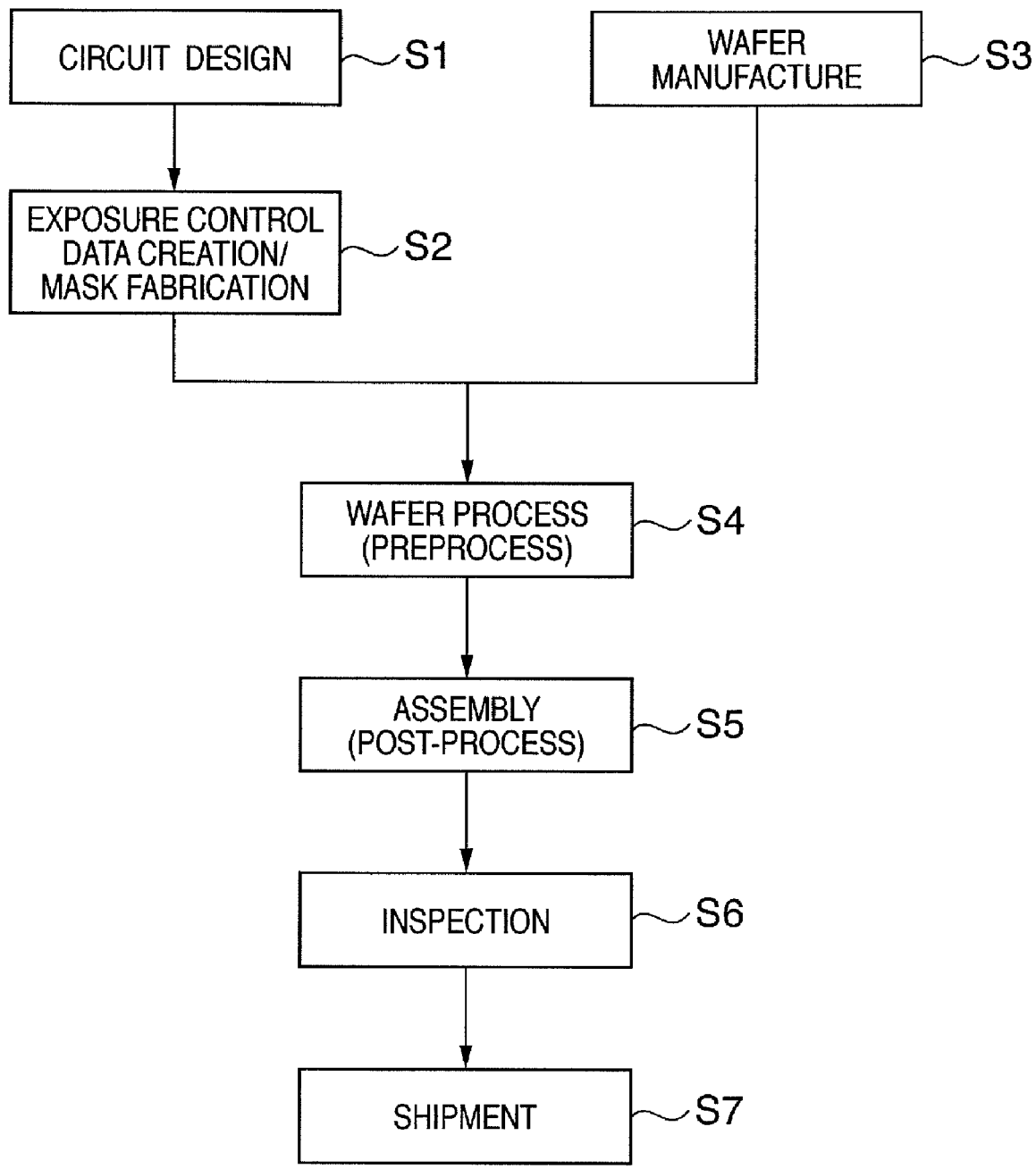
FIG. 14 is a flowchart for explaining a procedure for manufacturing a microdevice.

FIG. 14 shows a procedure for manufacturing a microdevice (a semiconductor chip such as an IC or LSI, a liquid crystal panel, a CCD, a thin-film magnetic head, or a micromachine). In step S1 (circuit design), the circuit of a semiconductor device is designed. In step S2 (exposure control data creation/mask fabrication), exposure control data of the exposure apparatus is created based on the designed circuit pattern, or a mask (also called a original or reticle) on which the designed circuit pattern is formed is fabricated. In step S3 (wafer manufacture), a wafer (also called a substrate) is manufactured using a material such as silicon. In step S4 (wafer process) called a pre-process, an actual circuit is formed on the wafer by lithography using the wafer and the exposure apparatus which has received the prepared exposure control data. Step S5 (assembly) called a post-process is the step of forming a semiconductor chip by using the wafer manufactured in step S4. This step includes processes such as assembly (dicing and bonding) and packaging (chip encapsulation). In step S6 (inspection), the semiconductor device manufactured in step S5 undergoes inspections such as an operation confirmation test and durability test. After these steps, the semiconductor device is completed and shipped in step S7.

Figure 15:
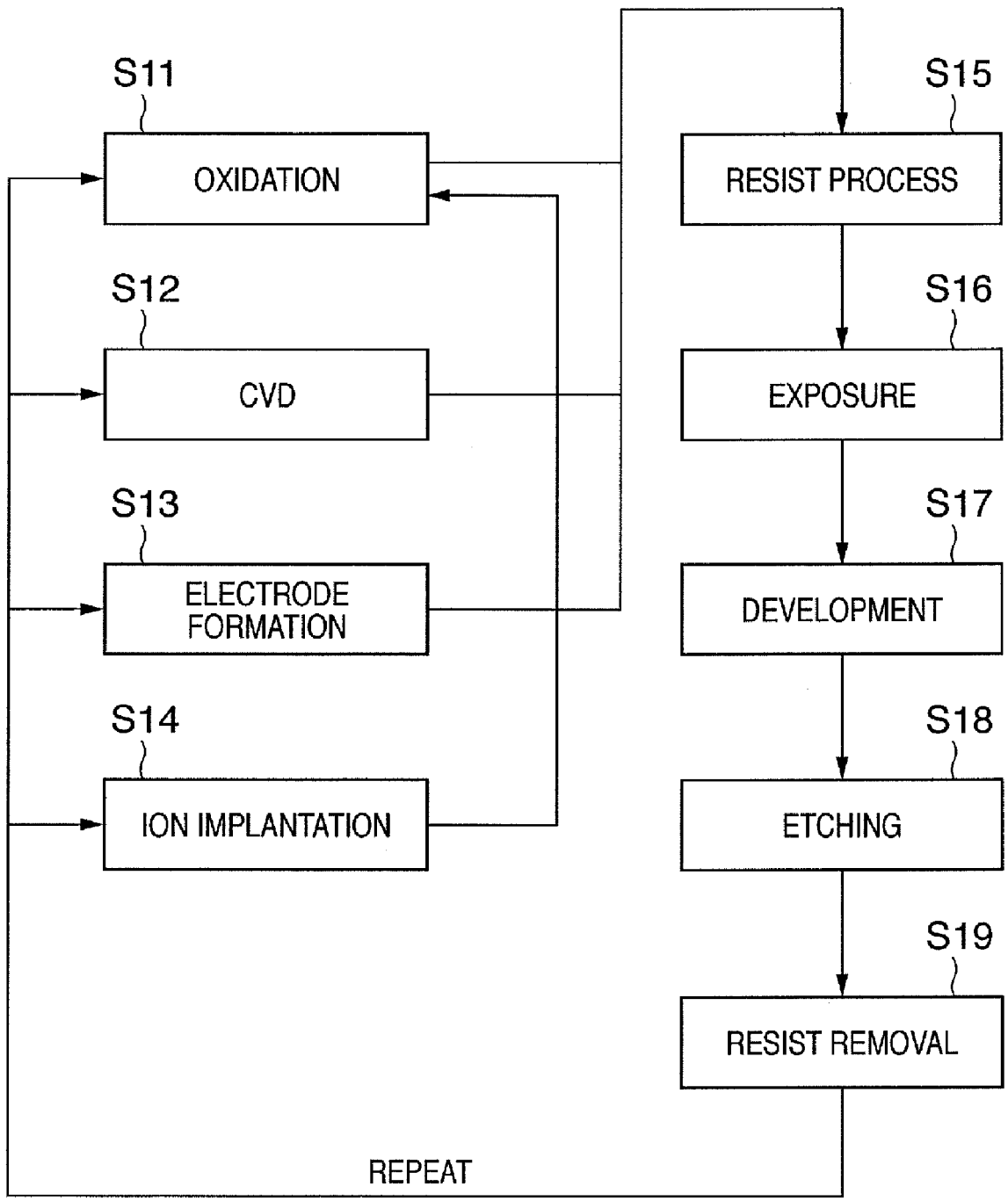
FIG. 15 is a flowchart for explaining the wafer process.

FIG. 15 shows the detailed procedure of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the wafer is exposed in accordance with the exposure control data or via the mask using the above-described exposure apparatus. In step S17 (development), the exposed wafer is developed. In step S18 (etching), portions other than the developed resist image are etched. In step S19 (resist removal), any unnecessary resist remaining after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-355304, filed Dec. 8, 2005, which is hereby incorporated by reference herein in its entirety.

What is claimed is:

1. An, apparatus for measuring at least one of arrangement and shape of shots formed on a substrate, the apparatus comprising:

a scope configured to obtain an image of an alignment mark formed on the substrate and corresponding to a shot; and a calculating device configured to obtain a position of the alignment mark on the substrate based on the obtained image to calculate a difference between the obtained position and a designed position of the alignment mark on the substrate, obtain a non-linear component of the calculated difference of each of a plurality of the shot with respect to each of a plurality of conditions, calculate an index indicating a stability of the non-linear component of each of the plurality of the shot with respect to each of the plurality of conditions, based on a first variation of a plurality of the non-linear component respectively obtained for the plurality of the shot on a plurality of substrates, and an average, over a plurality of different shot numbers, of second variations of a plurality of the non-linear component respectively obtained for a plurality of the shot having identical shot numbers on the plurality of substrates and select, from the plurality of conditions, a condition for obtaining the non-linear component based on the calculated indices.

2. An apparatus according to claim 1, wherein the calculating device is configured to divide the plurality of substrates into a plurality of groups based on data that represents tendencies of the non-linear component of the plurality of substrates, and select, from the plurality of conditions, a condition for obtaining the non-linear component with respect to each of the plurality of groups.

3. An apparatus according to claim 1, wherein the calculating device is configured to select, as the data that represents the tendencies, one of a largest one of the non-linear component and a magnification of each of the plurality of substrates.

4. An apparatus according to claim 1, wherein each of the plurality of conditions includes a condition for obtaining the non-linear component of a given shot based on the non-linear component of a shot neighboring the given shot.

5. An exposure apparatus for exposing a substrate to a pattern, the apparatus comprising:

a stage configured to hold the substrate and to be moved;

an apparatus defined in claim 1; and a controller configured to control a position of the stage based on the at least one of arrangement and shape measured by the apparatus defined in claim 1.

6. A method of manufacturing a device, the method comprising:

exposing a substrate to a pattern using an exposure apparatus defined in claim 5;

developing the exposed substrate; and processing the developed substrate to manufacture the device.

7. An apparatus according to claim 1, wherein the calculating device is configured to calculate the index based on a ratio between the first variation and the average.

8. An apparatus according to claim 1, wherein the calculating device is configured to use, as each of the first variation and the second variation, a standard deviation.

\* \* \* \* \*